(12) United States Patent
Asnaashari

(10) Patent No.: US 8,595,427 B1
(45) Date of Patent: Nov. 26, 2013

(54) NON-VOLATILE BLOCK STORAGE MODULE USING MAGNETIC RANDOM ACCESS MEMORY (MRAM)

(71) Applicant: Avalanche Technology, Inc., Fremont, CA (US)

(72) Inventor: Mehdi Asnaashari, Danville, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/791,452

(22) Filed: Mar. 8, 2013

(51) Int. Cl.
*G06F 12/00* (2006.01)
(52) U.S. Cl.
USPC ............................ 711/104; 711/102; 711/105
(58) Field of Classification Search
USPC .......................................... 711/102, 104, 105
See application file for complete search history.

(56) References Cited

U.S. PATENT DOCUMENTS

| | | | | |
|---|---|---|---|---|
| 6,031,843 | A * | 2/2000 | Swanbery et al. | 370/426 |
| 7,093,097 | B2 * | 8/2006 | Herr et al. | 711/171 |
| 2007/0168393 | A1 * | 7/2007 | Howell et al. | 707/200 |
| 2008/0288741 | A1 * | 11/2008 | Lee et al. | 711/200 |
| 2013/0145113 | A1 * | 6/2013 | Paperin et al. | 711/163 |
| 2013/0151767 | A1 * | 6/2013 | Berke et al. | 711/105 |

* cited by examiner

*Primary Examiner* — Mardochee Chery
(74) *Attorney, Agent, or Firm* — Maryam Imam; IPxLaw Group LLP

(57) ABSTRACT

A method and apparatus for accessing a storage media employed to store data from a host includes identifying a module as a block storage device. The block storage device is coupled to a host and includes a bridge controller and magnetic random access memory (MRAM). The MRAM has a buffer window for storing data from a host, the buffer window is movable throughout the MRAM. The bridge controller has a bridge controller buffer and controller registers. A request to access the block storage device is intercepted and a command to the block storage device is issued. If the command is a write command, at least a portion of the data to be saved into the MRAM is saved. The size of the at least a portion of the data is based on the capacity of the bridge controller buffer. Further, at least a portion of the data to the buffer window is transferred and upon having additional data to be saved into the MRAM, the buffer window is moved within the MRAM. Another portion of the data from the bridge controller buffer is transferred to the moved buffer window and the moving the buffer window and the transferring data steps are repeated until the data is transferred, in its entirety, from the host to the MRAM.

29 Claims, 5 Drawing Sheets

NON-VOLATILE BLOCK STORAGE MODULE USING MAGNETIC RANDOM ACCESS MEMORY (MRAM)

BACKGROUND OF THE INVENTION

1. Field of the Invention

This invention relates generally to a storage medium and more particularly to a method and apparatus for accessing the same.

2. Description of the Prior Art

Magnetic memory, such as magnetic random access memory (MRAM), shows exciting potential as the future's favorite memory in a wide variety of applications. This is arguably mostly attributable to manufacturing limitations faced by currently-popular memory, such as dynamic random access memory (DRAM) and static random access memory (SRAM). Such limitations include volatility of these memories. These devices will only hold their contents while power is being applied and loss their contents when power is removed. For example, current applications of non-volatile dual in-line memory module (NVDIMM) in the marketplace incorporate DRAM in addition to some sort of backup system such as batteries, super capacitors or a network of Tantalum caps, a PLD, power monitoring system, and non-volatile backup media such as NAND. During a system power interruption, the power monitoring system detects the interruption and directs the PLD to backup content of the DRAM devices onto an on-board Flash, such as NAND. When power is restored, the contents of the Flash are transferred back into the DRAM with no loss of critical data. This is obviously inconveniently time-intensive. One of the typical applications of such devices is a very high performance low latency block storage device closely coupled to the CPU in servers and blades.

Limitations are also faced by other types of widely-employed memory, such as flash memory. Such limitations include long write or program times and memory management expenses in that the memory must first be erased before being re-programmed which will not make them suitable for these high performance applications. In summary, the current implementation is costly, not green, requires backup to non-volatile (NV) media during power interruption and restoration on subsequent power up.

The foregoing limitations, in addition to others known in the industry, has prompted using MRAM as an alternative form of storage of information. In fact, MRAM is widely expected to replace traditional memory in the near future. However, replacing memory such as DRAM or SRAM or even flash with MRAM, presents its own set of problems, one of which is meeting requisite timing requirements in a system using traditional memory. In other words, simply replacing traditional memory with MRAM cannot be done in a plug-and-play setting because MRAM is quite different and therefore has its own set of requirements. For example, the host (or central processing unit (CPU)) in a computer or storage system employing MRAM cannot readily access the MRAM.

Thus, there is a need for a high performance host-based system employing MRAM with reduced latency

SUMMARY OF THE INVENTION

Briefly, a method and apparatus for accessing a storage media employed to store data from a host includes identifying a module as a non-volatile block storage device. The block storage device is coupled to a host and includes a bridge controller and magnetic random access memory (MRAM). The MRAM has a buffer window for storing data from a host, the buffer window is movable throughout the MRAM. The buffer window is defined as a region of the MRAM array employed by the bridge controller to read data from or to write data to at any given time. The bridge controller has a bridge controller buffer and controller registers. Size of the buffer window is determined, at least in part, by the size of the buffer in the bridge controller. A request to access the block storage device is intercepted and a command to the block storage device is issued. If the command is a write command, at least a portion of the data to be saved into the MRAM is transferred to the bridge controller buffer. The size of the at least a portion of the data is based on the capacity of the bridge controller buffer. Further, at least a portion of the data to the buffer window is transferred and upon having additional data to be saved into the MRAM, the buffer window is moved within the MRAM. Another portion of the data is transferred to the bridge controller buffer and from the bridge controller buffer is transferred to the moved buffer window and the moving the buffer window and the transferring data steps are repeated until the data is transferred, in its entirety, from the host to the MRAM.

These and other objects and advantages of the invention will no doubt become apparent to those skilled in the art after having read the following detailed description of the various embodiments illustrated in the several figures of the drawing.

IN THE DRAWINGS

DETAILED DESCRIPTION OF THE VARIOUS EMBODIMENTS

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the invention. It should be noted that the figures discussed herein are not drawn to scale and thicknesses of lines are not indicative of actual sizes.

In an embodiment of the invention, a method and apparatus for accessing a storage media employed to store data from a host includes identifying a module as a block storage device. The block storage device is coupled to a host and includes a bridge controller and magnetic random access memory (MRAM). The MRAM has a buffer window for storing data from a host, the buffer window is movable throughout the MRAM. The buffer window is defined as a region of the MRAM array that the bridge controller uses to read data from or to write data to at any given time. The bridge controller has a bridge controller buffer and controller registers. Size of the buffer window is similar to and in some embodiments defined by the size of the buffer in the bridge controller. A request to access the block storage device is intercepted and a command to the block storage device is issued. If the command is a write command, at least a portion of the data to be saved into the MRAM is saved. The size of the at least a portion of the data is based on the capacity of the bridge controller buffer. Further, at least a portion of the data to the buffer window is transferred and upon having additional data to be saved into the MRAM, the buffer window is moved within the MRAM. Another portion of the data from the bridge controller buffer is transferred to the moved buffer window and the moving the buffer window and the transferring data steps are repeated until the data is transferred, in its entirety, from the host to the MRAM.

Figure 1:
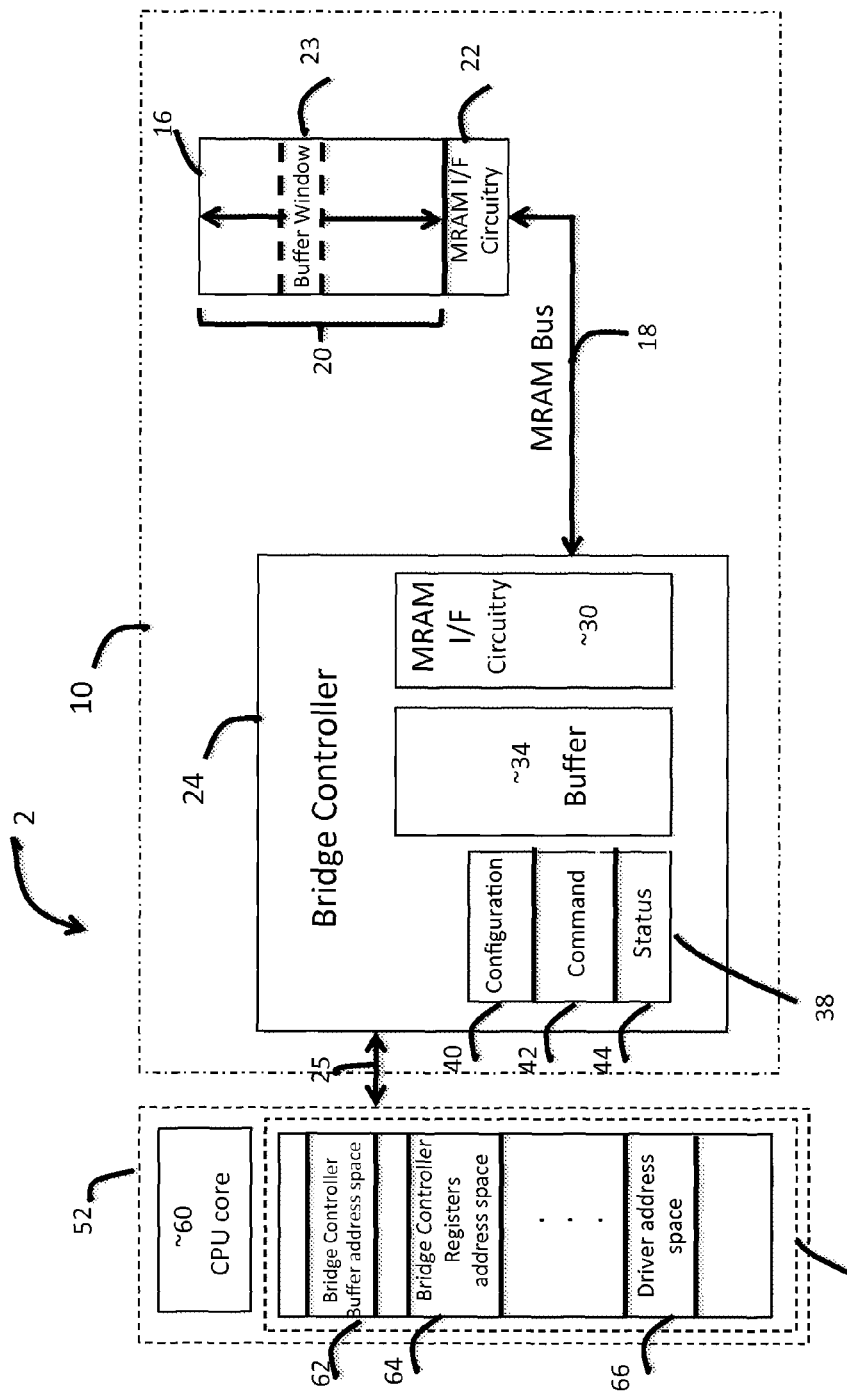
FIG. 1 shows a block diagram of a block storage module, in accordance with an embodiment of the invention.

Referring now to FIG. 1, a block diagram of a block storage system 2 is shown, in accordance with an embodiment of the invention. The storage system 2 is shown to include a central processing unit (CPU) 52 and a block storage module 10. The CPU 52, which is also referred to herein as a "host" or "microprocessor", sends commands and transfers data through a CPU bus 25, coupling the CPU 52 to the module 10. Data that is transferred between the CPU 52 and the module 10 is either stored in the module 10 or read from the module 10.

The module 10 is shown to include a bridge controller 24 and a magnetic random access memory (MRAM) device 16. The bridge controller 24 is shown to include controller registers 38, which are in turn shown to include configuration registers 40, command registers 42, and status registers 44. The bridge controller 24 is shown to further include a bridge controller buffer 34, and a MRAM interface circuitry 30. The MRAM device 16 is shown to include MRAM array 20 and a MRAM interface circuitry 22, the MRAM interface circuitry 22 shown coupled through a MRAM bus 18, to the bridge controller 24. A buffer window 23 in the MRAM array 20 moves throughout the MRAM array 20 during some of the times data is being written to or being read from the MRAM array 12, as will become evident shortly.

The CPU 52 is shown to include a CPU core 60 and CPU address space 68 from which the CPU can execute codes (or programs). The CPU address space 68 is shown in relevant part to include a bridge controller buffer address space 62, a bridge controller registers address space 64, and a driver address space 66. As is known in the art, address spaces, such as address space 62, 64, and 66 each identify the location where respective data is saved. For example, the address space 66 identifies a location within memory where the driver is saved.

The address space 62 advantageously provides access to the MRAM array 20 through the bridge controller buffer 34. In the embodiment of FIG. 1, bridge controller buffer 34 is mapped into the address space 62 of the CPU 52 allowing the CPU 52 access to the array 20 through the bridge controller buffer 34. A driver being executed from a driver portion of the address space 68 facilitates the transfer of data from a memory such as DRAM or SRAM mapped to a CPU portion of the address space 68 to the bridge controller buffer 34.

Each of the address spaces 62, 64, and 66 identify an area within the CPU portion of the address space 68 in which a physical memory device, such as DRAM or SRAM, is located. For example, the space 62 identifies the address space that CPU 52 uses to access the buffer 34 to read data from or to write data to. Similarly, controller registers 38 of the controller 24 are mapped to the CPU portion of the address space 64 and the driver that directs writing into or reading from the module 10 by accessing the controller registers and buffer through their associated addresses. The driver typically resides in a memory such as DRAM or SRAM and is mapped to the CPU portion of the address space 66. The controller registers are typically implemented in ASIC and are mapped to CPU portion of the address space 64 and buffer are typically a memory such as DRAM or SRAM and is mapped to the CPU portion of the address space 62.

The configuration registers 40 are used by the driver to direct the bridge controller 24 to certain locations and memory sizes, such as in an exemplary embodiment the location and size of the MRAM array in which data is being written or from which data is being read. The command registers 42 are used by the driver to direct the bridge controller 24 to certain operations, such as in some embodiments, to read from or to write to the MRAM array. In some embodiments, the status registers 44 indicates the status of the command in progress such as if the command has completed successfully or the command remains in progress. The circuitry 30 is an interface through which the controller 24 communicates with the MRAM device 16 via the MRAM bus 18. That is, the data that is written to the controller registers 38 and the buffer 34 by the driver go through the circuitry 30 to couple information through the MRAM bus 18 to the MRAM devices 16. Similarly, data that is being read from the MRAM device go through the circuitry 30 via the MRAM bus 18 to the controller buffer 34.

The MRAM interface circuitry 22, analogously to the circuitry 30, causes communication between the MRAM array 12 and the controller 24 and further controls writing and reading of data to and from the MRAM 20 and includes circuits such as row and column decoders.

The CPU 52, in some embodiments, is an ARM, an ARC, or any Intel X86.

In operation, during a write operation, initiated by an application and under the direction of the driver, executed by the CPU core 60 from memory mapped to the driver address space 66, a module, to be written to, is identified as the module 10. A request initiated by the application to access the module 10 is intercepted by the driver. Next, a command is issued by the driver to the controller registers 38 of the module 10. The command identifies the block address (either physical or logical) and size of the data corresponding to the request. In some embodiment, the driver may send one command to the module 10 corresponding to the request or in some other embodiment, the driver may break the request into multiple commands. Assuming the command is a write command, at least a portion of the data to be saved into the MRAM array 20 is sent directly by the CPU 52 under direction of the driver through the CPU bus 25 and saved in the buffer 34. The size of the portion of data being saved in the buffer 34 is based on the capacity or size of the buffer 34. Next, the data that is saved in the buffer 34 is transferred; under the direction of the bridge controller 24 to the buffer window 23 of the MRAM array 20 through the circuitry 30 via MRAM bus 18. The starting location of the buffer window is set by the bridge controller 24 based on the data in the configuration registers 40 written by the driver and size of the buffer window is determined by size the buffer 34. If the data is larger than the size of the buffer 34, the remainder or at least a part of the remainder, as the case may be in accordance with the size of the buffer 34, the buffer window 23 is moved up and/or down the MRAM 20 identifying another area of the MRAM 20 in which the contents of the buffer 34 are saved. This process is repeated until all of the data that is intended to be saved is transferred into the MRAM array 20. In this respect, data is saved in the MRAM array 20 in a manner analogous to saving data into a DRAM, from the perspective of the CPU core 60, with the exception that saving of data is performed on a piece-mill basis with the size of each piece being dependent on the configuration of the controller buffer 34. Further, the controller buffer 34 and the controller registers 38 are directly coupled to the CPU 52 and they are therefore directly accessible by the CPU 52 without going through another interface or translation.

It is noted that the system 2 is regarded as an embedded application of the module 10 where the CPU bus 25 is exposed and accessible by an external device, such as a graphics card, memory controller, RAM, PCIA controller, or any other requisite device that meets the timing requirements of the CPU bus 25. In some of the figures to follow, such as FIG. 3, a non-embedded application of a system 4 is shown and described with the CPU bus 25 no longer being exposed, whereas other busses, such as a memory bus 26 is exposed.

Figure 2:
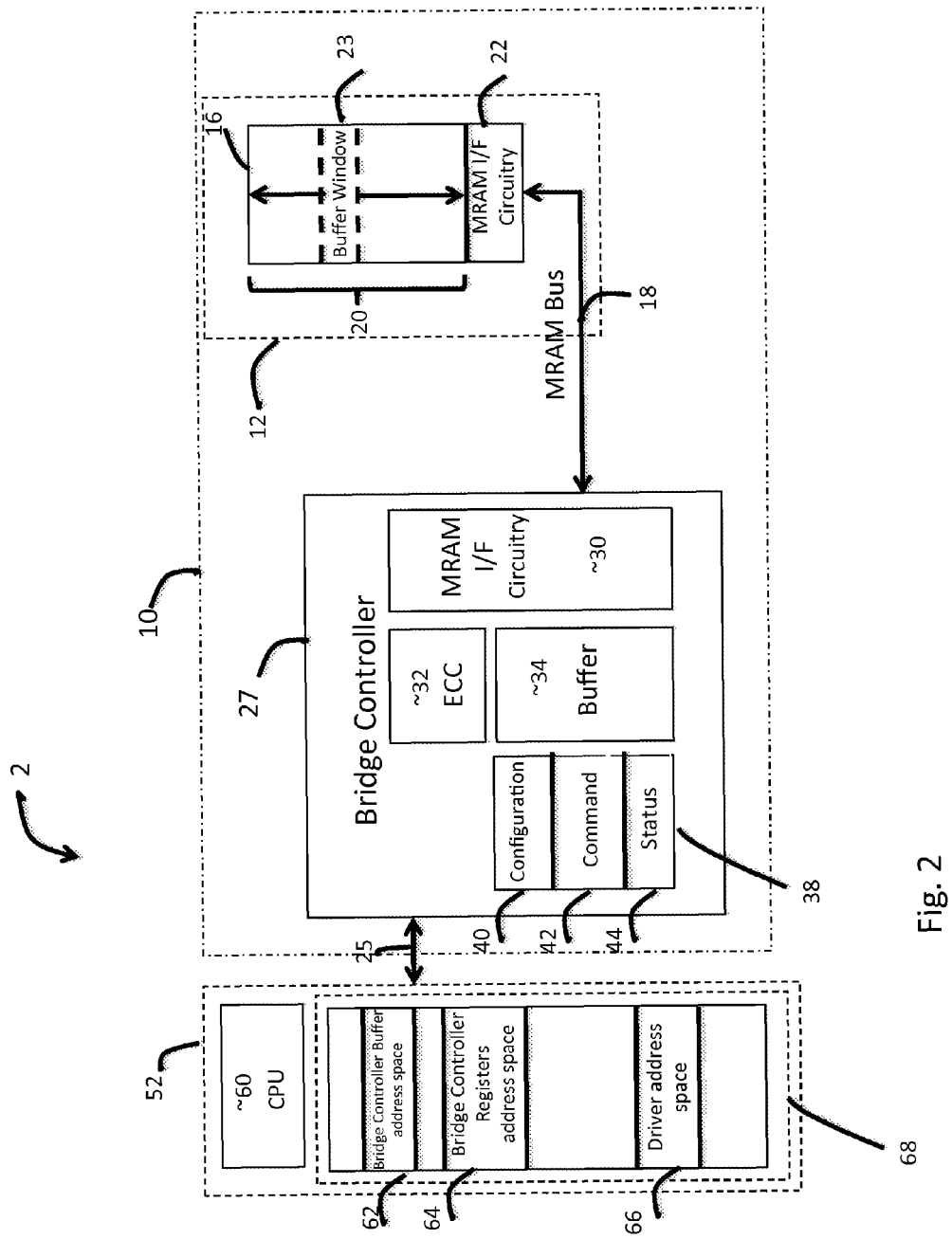
FIG. 2 shows a block diagram of a block storage module, in accordance with another embodiment of the invention.

FIG. 2 shows a block diagram of a block storage system, in accordance with another embodiment of the invention. In particular the module 10 includes a bridge controller 27 rather than the bridge controller 24 of the embodiment of FIG. 1. The bridge controller 27 is analogous to the bridge controller 24 except that it includes an error coding and correction (ECC) 32. The ECC 32 encodes data in the buffer 34 that is to be saved in the MRAM 20, prior to being saved therein, and decodes and at times corrects data that is to read from the MRAM 20. Examples of ECC are cyclic error-correcting codes such as BCH or Hamming code single error correction, and double error detection (SECDED).

Figure 3:
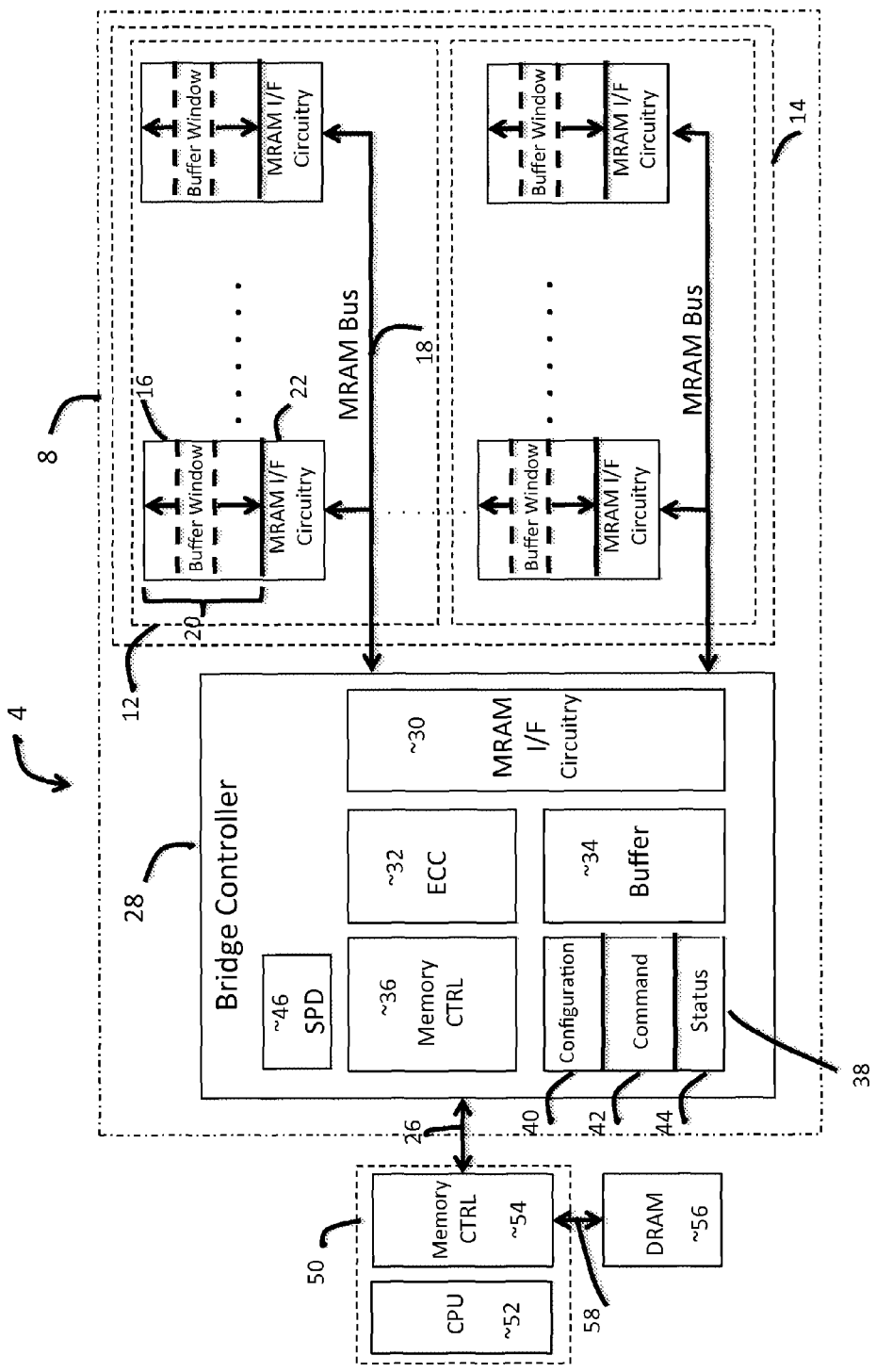
FIG. 3 shows a block diagram of a block storage module, in accordance with yet another embodiment of the invention.

FIG. 3 shows a block diagram of a block storage system 4, in accordance with another embodiment of the invention. The system 4 is analogous to the system 2 of FIGS. 1 and 2 with the following exceptions. The CPU subsystem 50 is shown to include a memory controller 54 in addition to the CPU 52. Additionally, the block storage module 10 of FIGS. 1 and 2 is replaced with the block storage module 8, in FIG. 3. The module 8 is shown to include a bridge controller 28 rather than the bridge controller 27 of the embodiment of FIG. 2 and that of FIG. 1. The bridge controller 28 is analogous to the bridge controller 27 except that it includes a bridge controller memory controller 36 to allow the module 8 to be in direct communication with the CPU subsystem 50 through the memory bus 26. In the embodiment of FIG. 3, the controller registers 38 and the buffer 34 are in direct communication with the memory controller 54 and not the CPU 52, the latter being the case in the embodiments of FIGS. 1 and 2. In FIG. 3, the memory controller 54 is shown coupled to the CPU 52 in the CPU subsystem 50 and it serves to receive stream of read and write commands from CPU 52 and converting them to DDR protocol as well as scheduling specific tasks required for DRAM or SDRAM proper operations such as precharge, bank activate, and refresh commands to optimize the memory bus.

In the embodiment of FIG. 3, all accesses by the CPU 52 to the configuration registers 38 and the buffer 34, under direction of the driver, are directed to the memory controller 54 and the memory controller 54 directly accesses the controller registers 38 and the buffer 34 through the memory bus 26 and the memory controller 36.

Another notable difference between the system 4 of FIG. 3 and the system 2 of FIG. 1 is the block storage media 14, in FIG. 3, which is shown coupled to the bridge controller 28 through the MRAM interfaces 18 in that the media 14 is shown to include a number of MRAM devices 16, each of which is shown to include the array 20 and a MRAM interface circuitry 22. It is understood that while not shown, the MRAM array 12 of FIG. 1 may include more than one MRAM devices 16.

The embodiment of FIG. 3 is shown to include a DRAM 56 coupled to the memory controller 56 of the CPU subsystem 50 via DRAM bus 58. The DRAM 56 is located externally to the block storage module 8 and the CPU subsystem 50. In other embodiments, the DRAM 56 may be internal to the CPU subsystem 50 In some embodiment of the invention, the DRAM 56 is mapped to a DRAM controller address space within the CPU address space 68, The DRAM 56 is used by the CPU 52, under direction of the driver, discussed hereinabove, to store data that is read from the buffer 34 or to retrieve data to be written to the buffer 34.

In some embodiments, the DRAM 56 may include the driver that is mapped to the CPU address space 66. Bridge controller buffer address space 62 and configuration registers address space 64 are also mapped to DRAM controller address space within the CPU addresses space 68.

The memory bus 26 and DRAM bus 58 in some embodiment are DDR2, DDR3, DDR4, LPDDR2 or LPDDR3 compliant and the memory controller 54 and 36 are similarly DDR2, DDR3, DDR4, LPDDR2 or LPDDR3 types of controllers.

FIG. 3 further shows a serial presence detect (SPD) circuitry 46 which is used by the CPU 52 to read the configuration information of the module 10, such as timing parameters and the manufacturer's information, during power-up, and to initialize the memory controller 54 accordingly. The content of the SPD circuitry 46 may reside in a private portion of one of the MRAM devices, such as the device 16. In some embodiment of the invention, multiple copies of the content of the SPD circuitry 46 may be a part of one or more of the MRAM devices in the case where the primary copy is corrupted.

Figure 4:
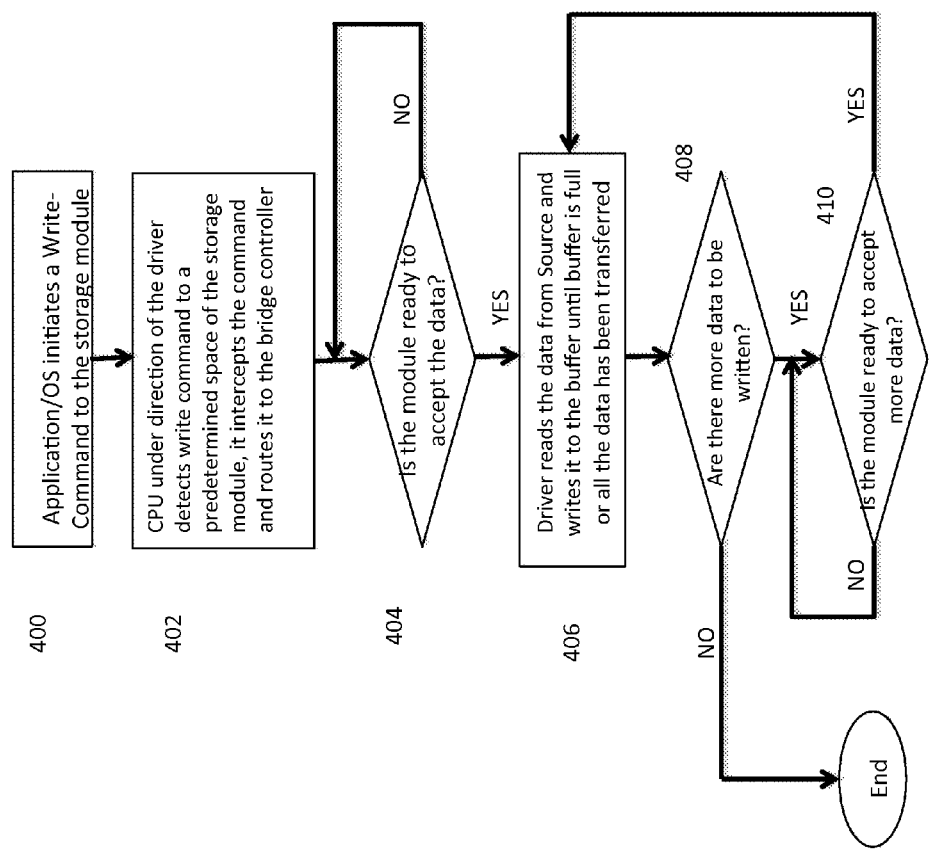
FIG. 4 shows a flow chart of write operation, in accordance with yet another embodiment of the invention.

In some embodiment, where the SPD circuitry 46 has reserved bytes, the reserved bytes may be used to communicate block storage characteristics, such as capacity, maximum number of logical block address (LBA), size of the buffer 34, and number of the buffers 34 to the CPU 52, under direction of the driver, during the power-up sequence. In such embodiments, the driver uses some of the reserved byte information to notify the host (or CPU 52) of the presence of such a block storage device and some other bytes to efficiently schedule read and write commands to the module FIG. 4 shows a flow chart of write operation, in accordance with a method of the invention, the steps of which are performed by a block storage system of an embodiment of the invention, such as the system 2. System 2 is used as an example to explain the steps of FIGS. 4 and 5. In FIG. 4, at step 400, an application initiates a write operation to the non-volatile block storage module 10. Next, at step 402, CPU 52 under direction of the driver residing in the space 66 of the CPU 52, detects the write command of step 400, which is a write to a predetermined space of the storage module 10. The driver intercepts the write command and routes it to the controller 24 by writing to the controller registers 38.

Next, at 404, a determination is made as to whether or not the storage module 10 is ready to accept the data that is to be written from the CPU 52 and if not, the process waits at 404, otherwise, the process continues to step 406. At step 406, the CPU 52 reads the data from a predetermined address of the address space 68 and writes it directly to the buffer 34 by writing to the address space 62 until either the buffer 34 becomes full or all of the data that is to be written has been transferred to the buffer 34.

Next, at 408, a determination is made as to whether or not there is more data to be written and if not, the process ends, otherwise, the process continues to 410 where another determination is made. At 410, a determination is made as to whether or not the module 10 is ready to accept additional data and if not, the process waits until the module 10 has completed the transfer of the data from the buffer 34 to the MRAM array 20 buffer window 23 and is ready to accept additional data, otherwise, the process continues to the step 406 and repeats as discussed above. It is noted that the operating system or an application initiates the write operation to the module 10 in step 400 and then the CPU 52 under direction of driver performs rest of the steps and determinations of the process of FIG. 4.

Figure 5:
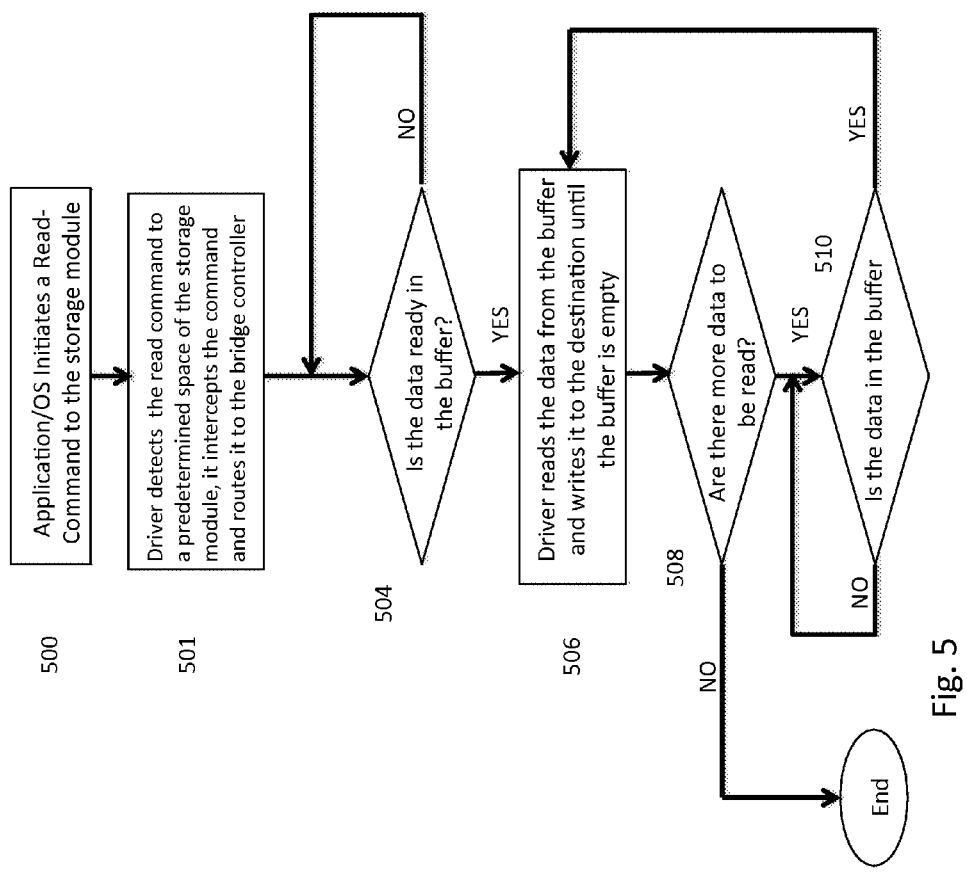
FIG. 5 shows a flow chart of read operation, in accordance with yet another embodiment of the invention.

FIG. 5 shows a flow chart of a read operation, in accordance with a method of the invention, the steps of which are performed by a block storage system of an embodiment of the invention, such as the system 2. At step 500, the application or OS initiates a read command to the non-volatile block storage module 10. Next, at step 501, the CPU 52 under direction of the driver detects the read command to a predetermined space of the storage module 10. The driver intercepts the read command and routes it to the controller 24 by writing to the controller registers 38.

Next, at 504, a determination is made by the driver as to whether or not the data that is to be read from the storage media 12 is ready in the buffer 34 by reading the status register 44. If data is not ready in the buffer, the process waits until such time as when the data is ready, otherwise, the process continues to step 506. At step 506, the CPU 52 under direction of the driver reads the data directly from the buffer 34 and writes the read data to a destination address space until the buffer 34 is empty or all data has been read. Next, at 508, a determination is made as to whether or not additional data is to be read and if not, the process ends, otherwise, the process continues to 510 where another determination is made as to whether or not data remains in the buffer 34 and if not, the process waits until there is additional data and if not, the process continues to the step 506 and repeats from there. It is noted that the operating system or an application initiates the read operation to the module 10 in step 500 and then the CPU 52 under direction of driver performs rest of the steps and determinations of the process of FIG. 5.

At each of the steps 404, 408, 504, and 508, in FIGS. 4 and 5, a couple of ways of waiting for data may be employed such as polling a status register, such as the register 44, in FIG. 1, or sending an interrupt to the CPU, such as the CPU 52, when data is ready.

It is contemplated that the steps of FIGS. 4 and 5 are analogously performed by the system 4 of FIG. 3.

Due to the characteristics of MRAM devices, DRAM-like performance is realized by the various embodiments of the invention while enjoying the non-volatility attribute of MRAM.

In some embodiments, the bridge controller, such as the controller 24 of FIG. 1, the controller 27 of FIG. 2, or the controller 28 of FIG. 3, each may include multiple bridge controller buffers in which case performance is improved over that of the embodiments of FIGS. 1-3 because data is pipelined.

Although the invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of accessing a block storage module employed to store data from a host comprising:

identifying a module as a non-volatile block storage module, the non-volatile block storage module being coupled to a host that includes a bridge controller buffer address space, the block storage module including a bridge controller and a magnetic random access memory (MRAM), the MRAM including a MRAM array, the MRAM array having a buffer window for storing data from a host, the buffer window being movable throughout the MRAM array, the bridge controller having a bridge controller buffer and controller registers, the MRAM array being mapped into bridge controller buffer address space of the host to allow direct access of the MRAM array by the host;

intercepting a request to access the block storage module;

issuing a command to the block storage module;

if the command is a write command, saving at least a portion of the data to be saved into the MRAM array, size of the at least a portion of data being based on the capacity of the bridge controller buffer;

transferring the at least a portion of data to the buffer window and upon having additional data to be saved into the MRAM, moving the buffer window within the MRAM; and transferring another portion of the data from the bridge controller buffer to the moved buffer window and repeating the moving the buffer window and the transferring data steps until the data is transferred, in its entirety, from the host to the MRAM, wherein the host has direct access to the bridge controller buffer and the configuration registers.

2. The method of accessing, as recited in claim 1, wherein the host is CPU.

3. The method of accessing, as recited in claim 2, wherein the host is a memory controller.

4. The method of accessing, as recited in claim 1, wherein the steps of identifying, intercepting, issuing, and transferring are performed by a driver.

5. The method of accessing, as recited in claim 1, wherein if the command is a read command, reading data from the MRAM by:

transferring at least a portion of the data to be read from the MRAM array to the bridge controller buffer, the size of the at least a portion of data being based on the capacity of the bridge controller buffer, and upon having additional data to be read from the MRAM, moving the buffer window within the MRAM;

transferring the data in the bridge controller buffer directly to the host, and transferring another portion of the data from the MRAM array to the bridge controller buffer and repeating the moving the buffer window and the transferring data steps until the data is transferred, in its entirety, from the MRAM to the host.

6. A block storage system including a central processing unit (CPU) subsystem having a driver executed by a CPU within the CPU subsystem, the block storage system comprising:

a non-volatile block storage module including a bridge controller and a MRAM device, the bridge controller coupled to the MRAM device, the bridge controller including a bridge controller buffer and the MRAM device including a magnetic random access memory (MRAM) having a MRAM array with a buffer window, the buffer window being moveable within the MRAM array to allow contents of the bridge controller buffer to be saved into the MRAM array even when the capacity of the bridge controller buffer is less than the size of data being saved in the non-volatile block storage, the contents of the bridge controller buffer being at least a portion of the data to be saved in the MRAM array or to be read from the MRAM array, wherein the bridge controller buffer is mapped into a host address space thereby allowing the bridge controller buffer to be directly accessible by the host.

7. The block storage system of claim 6 further including a MRAM bus coupled to the bridge controller and the MRAM device.

8. The block storage system of claim 6 wherein the bridge controller further includes configuration registers, command registers, and status registers.

9. The block storage system of claim 6 wherein the bridge controller further includes an error coding and correction (ECC).

10. The block storage system of claim 6 wherein the MRAM includes more than one MRAM device, each of the more than one MRAM devices being coupled to the bridge controller.

11. A block storage system including a central processing unit (CPU) subsystem having a driver executed by a CPU within the CPU sub-system, the block storage system comprising:
 a block storage module coupled to the CPU sub-system including,
  a bridge controller,
  a plurality of magnetic random access memory (MRAM) devices, the bridge controller coupled to the plurality of MRAM devices and including a bridge controller buffer and a bridge controller memory controller, each of the plurality of MRAM devices including a MRAM having a MRAM array with a buffer window, the buffer window being moveable within a corresponding MRAM array to allow contents of the bridge controller buffer to be saved into the corresponding MRAM array even when the capacity of the bridge controller buffer is less than the size of the data being saved into the MRAM array, the contents of the bridge controller buffer defining the data being saved into the MRAM array and updated by the CPU,
 wherein the bridge controller memory controller allows the block storage module to be in direct communication with the CPU subsystem.

12. The block storage system of claim 11 wherein the CPU sub-system further includes a memory controller and the block storage module is coupled to the CPU sub-system through a memory bus.

13. The block storage system of claim 11 wherein the block storage module is coupled to the CPU sub-system through a CPU bus.

14. The block storage system of claim 12 wherein the bridge controller includes controller registers and the controller registers and the bridge controller buffer are in direct communication with the memory controller.

15. The block storage system of claim 12 wherein the memory bus and DRAM bus are DDR2, DDR3, DDR4, LPDDR2 or LPDDR3 compliant.

16. The block storage system of claim 12 wherein the memory controller and the bridge controller memory controller are each DDR2, DDR3, DDR4, LPDDR2 or LPDDR3 types of controllers.

17. The block storage system of claim 12, further including a DRAM coupled to the memory controller, the DRAM being used by the CPU to store data that is read from the bridge controller buffer and to retrieve data to be written to the bridge controller buffer.

18. The block storage system of claim 17, wherein the DRAM is mapped to a DRAM controller address space within the CPU sub-system.

19. The block storage system of claim 17, wherein the DRAM includes the driver.

20. The block storage system of claim 12, wherein the bridge controller further includes a serial presence detect (SPD) circuitry employed by the CPU to read a configuration information of the block storage module during power-up of the block storage system and to further initialize the memory controller.

21. The block storage system of claim 20, wherein at least one copy of the content of the SPD circuitry resides in a private portion of plurality of the MRAM devices.

22. The block storage system of claim 20, wherein the SPD circuitry has reserved bytes used to communicate block storage module characteristics, during power-up.

23. The block storage system of claim 22, wherein the driver uses the reserved bytes to notify the CPU of the presence and characteristics of the block storage module.

24. The block storage system of claim 11 further including a MRAM bus coupled to the bridge controller and the MRAM device.

25. The block storage system of claim 11 wherein the bridge controller further includes configuration registers, command registers, and status registers.

26. The block storage system of claim 11 wherein the bridge controller further includes an error coding and correction (ECC).

27. The block storage system of claim 11 wherein the MRAM includes more than one MRAM device, each of the more than one MRAM devices being coupled to the bridge controller.

28. The block storage system of claim 11 wherein multiple bridge controller buffers are employed.

29. A block storage system including a central processing unit (CPU) subsystem having a driver executed by a CPU within the CPU sub-system, the block storage system comprising:
 a block storage module coupled to the CPU sub-system including,
  a bridge controller,
  a plurality of magnetic random access memory (MRAM) devices, the bridge controller coupled to the plurality of MRAM devices and including a bridge controller buffer and a bridge controller memory controller, each of the plurality of MRAM devices including a MRAM having a MRAM array with a buffer window, the buffer window being moveable within a corresponding MRAM array to allow contents of the MRAM array to be read by the CPU through the bridge controller buffer even when the capacity of the bridge controller buffer is less than the size of the data being read from the MRAM array,
 wherein the bridge controller memory controller allows the block storage module to be in direct communication with the CPU subsystem.

* * * * *